US010155872B2

(12) United States Patent
Williams

(10) Patent No.: US 10,155,872 B2
(45) Date of Patent: Dec. 18, 2018

(54) NANOCOMPOSITE OPTICAL-DEVICE WITH INTEGRATED CONDUCTIVE PATHS

(71) Applicant: Vadient Optics, LLC, Beaverton, OR (US)

(72) Inventor: George Williams, Portland, OR (US)

(73) Assignee: Vadient Optics, LLC, Beaverton, OR (US)

(*) Notice: Subject to any disclaimer, the term of this patent is extended or adjusted under 35 U.S.C. 154(b) by 1097 days.

(21) Appl. No.: 14/307,071

(22) Filed: Jun. 17, 2014

(65) Prior Publication Data
US 2015/0362762 A1 Dec. 17, 2015

(51) Int. Cl.
*C09D 11/00* (2014.01)
*C09D 11/52* (2014.01)
*G02B 1/12* (2006.01)
*B82Y 30/00* (2011.01)
*C09D 11/322* (2014.01)
*B82Y 40/00* (2011.01)
*B82Y 20/00* (2011.01)
*G02B 1/00* (2006.01)
*H01L 29/16* (2006.01)

(52) U.S. Cl.
CPC ............ *C09D 11/00* (2013.01); *C09D 11/322* (2013.01); *C09D 11/52* (2013.01); *G02B 1/002* (2013.01); *H01L 29/1606* (2013.01); *B82Y 20/00* (2013.01); *B82Y 30/00* (2013.01); *B82Y 40/00* (2013.01); *Y10T 428/24802* (2015.01); *Y10T 428/24917* (2015.01); *Y10T 428/24926* (2015.01)

(58) Field of Classification Search
CPC ...... G02F 1/0018; G09D 11/52; G09D 11/00; C09D 11/00; G02B 1/12

USPC ....... 136/252, 253, 254, 255, 256, 257, 258, 136/259, 260, 261, 262, 263, 264, 265
See application file for complete search history.

(56) References Cited

U.S. PATENT DOCUMENTS 5,498,444 A 3/1996 Hayes
5,707,684 A 1/1998 Hayes et al.
5,800,000 A 9/1998 Shockley
(Continued)

FOREIGN PATENT DOCUMENTS

EP 2412767 A1 2/2012
EP 2474404 A1 6/2012
(Continued)

OTHER PUBLICATIONS

Richard Chartoff, et al., Functionally Graded Polymer Matrix Nano-Composites by Solid Freeform Fabrciation: A Preliminary Report, Solid Freeform (SFF) symposium, [online], 2003, pp. 385-391, [retrieved on Apr. 23, 2015]. from the Internet: <http://sffsymposium.engr.utexas.edu/Manuscripts/2003/2003-36-Chartoff.pdf>.
(Continued)

*Primary Examiner* — William K Cheung

(57) ABSTRACT

A nanocomposite optical device comprising a cured optically transparent nanocomposite ink and a treated conductive nanocomposite-ink. The treated conductive nanocomposite-ink integrated within the nanocomposite structure. The treated nanocomposite-ink having electrical, thermal or both electric and thermal communication to the exterior of the optical device and the same communication with at least a portion of the optically transparent nanocomposite within the optical-device.

27 Claims, 7 Drawing Sheets

(56) References Cited

U.S. PATENT DOCUMENTS

| | | | |
|---|---|---|---|
| 5,807,906 | A | 9/1998 | Bonvallot et al. |
| 6,593,415 | B2 | 7/2003 | Koike et al. |
| 6,656,990 | B2 | 12/2003 | Shustack et al. |
| 6,805,902 | B1 | 10/2004 | Hayes |
| 6,836,371 | B2 | 12/2004 | Lai et al. |
| 6,934,088 | B2 | 8/2005 | Lai et al. |
| 6,976,641 | B2 | 12/2005 | Lai et al. |
| 2012/0305061 | A1* | 12/2012 | O'Brien ............... C03C 17/006 136/255 |
| 2013/0083405 | A1 | 4/2013 | Trajkovska et al. |
| 2014/0079932 | A1 | 3/2014 | Aksay et al. |
| 2014/0134421 | A1 | 5/2014 | Hu et al. |
| 2015/0021528 | A1 | 1/2015 | Chartoff et al. |
| 2015/0023643 | A1 | 1/2015 | Chartoff et al. |

FOREIGN PATENT DOCUMENTS

| | | |
|---|---|---|
| EP | 2469309 B1 | 8/2013 |
| EP | 2392473 B1 | 9/2013 |
| EP | 2541559 B1 | 3/2014 |
| WO | PCT2010/001124 A1 | 3/2013 |

OTHER PUBLICATIONS

Richard Chartoff, et al., Polymer Matrix Nanocomposites by Inkjet Printing, Solid Freeform (SFF) symposium, [online], 2005, pp. 174-183, [retrieved on Apr. 23, 2015]. from the Internet: <http://sffsymposium.engr.utexas.edu/Manuscripts/2005/2005-16-Chartoff.pdf>.

* cited by examiner

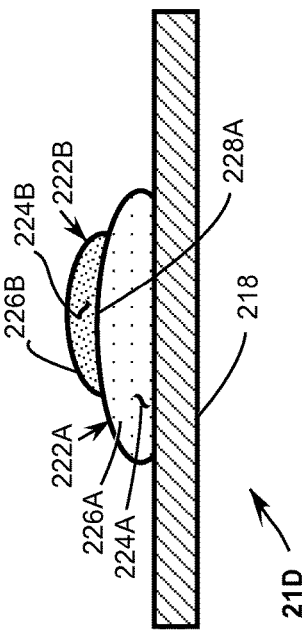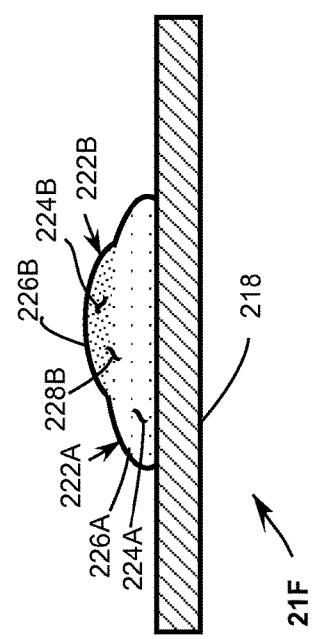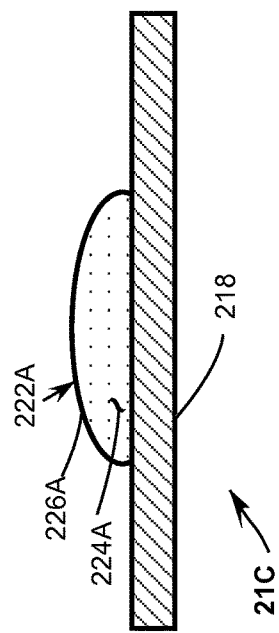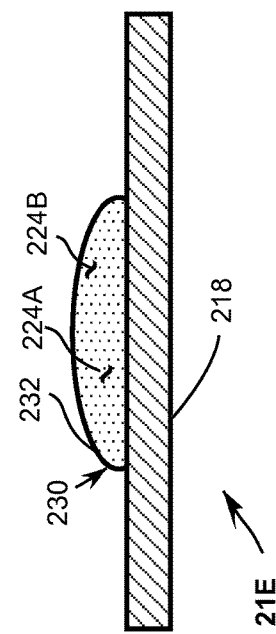

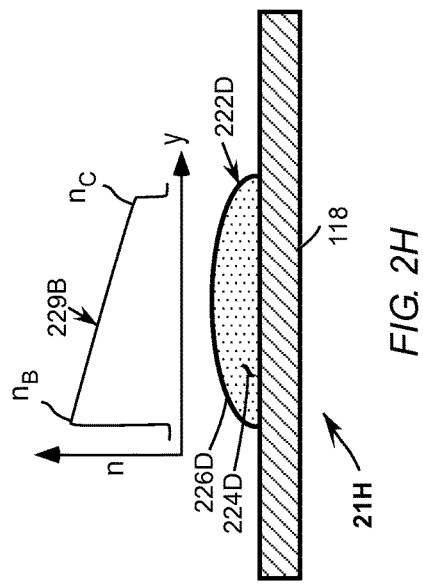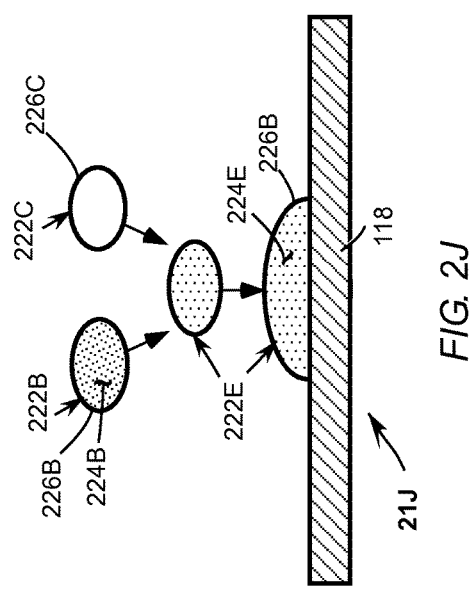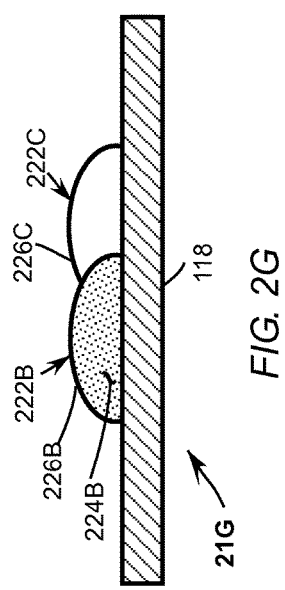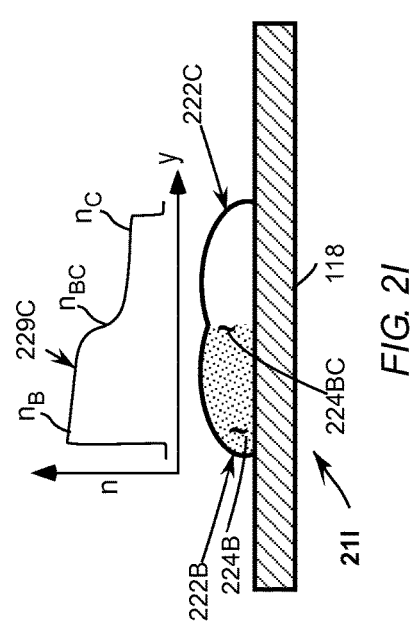

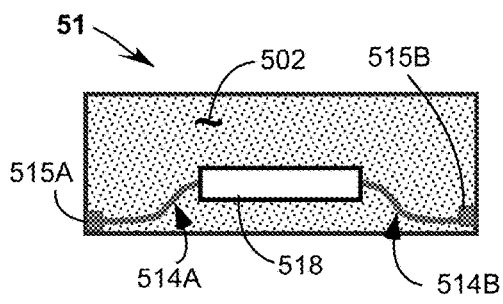
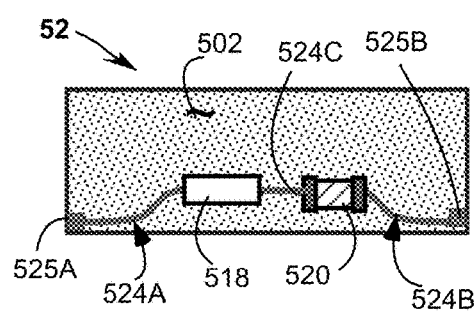
FIG. 5A
FIG. 5B
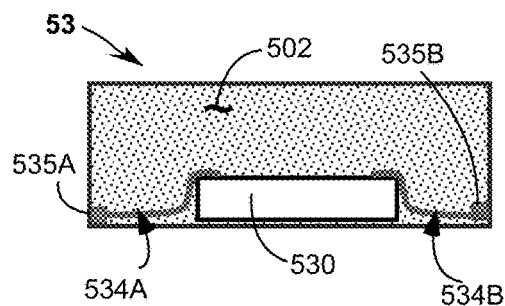
FIG. 5C
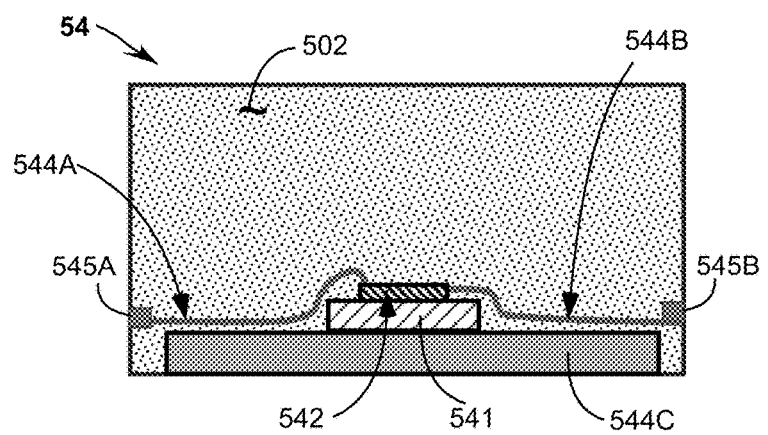
FIG. 5D

NANOCOMPOSITE OPTICAL-DEVICE WITH INTEGRATED CONDUCTIVE PATHS

TECHNICAL FIELD OF THE DISCLOSURE

The present disclosure relates in general to nanocomposite optic devices and elements. The disclosure relates in particular to methods of manufacturing nanocomposite optical devices with integrated conductive electrodes using ink-jet printable nanocomposite materials.

DISCUSSION OF BACKGROUND ART

To provide devices electrical communication, especially embedded devices, routing for wiring must be provided. The wiring must be soldered onto electrical elements during or after the manufacturing process, typically interrupting the manufacturing process. To provide thermal communication, for a heat sink for instance, similar routing must be provided with a thermal path to the exterior of the device. This application relates to another approach.

SUMMARY OF THE DISCLOSURE

The present disclosure is directed to nanocomposite refractive-gradient optical-devices. In one aspect, a nanocomposite optical device comprises of a cured optically transparent nanocomposite ink and a treated conductive nanocomposite-ink. The treated conductive nanocomposite-ink integrated within the nanocomposite structure. The treated nanocomposite-ink having electrical, thermal or both electric and thermal communication to the exterior of the optical device and the same communication with at least a portion of the optically transparent nanocomposite within the optical-device.

BRIEF DESCRIPTION OF THE DRAWINGS

The accompanying drawings, which are incorporated in and constitute a part of the specification, schematically illustrate preferred embodiments of the present disclosure, and together with the general description given above and the detailed description of preferred methods and embodiments, given below, serve to explain principles of the present disclosure.

FIG. 2C is a cross-section view, schematically illustrating nanocomposite-ink deposited on a substrate.

FIG. 2D is a cross-section view, schematically illustrating an additional deposit of nanocomposite-ink.

FIG. 2E is a cross-section view, schematically illustrating the resultant nanocomposite from the diffusion or convective mixing of nanofillers from the first and the second nanocomposite-ink as shown in FIG. 2D.

FIG. 2F is a cross-section view, schematically illustrating a resultant refractive-gradient between the first nanocomposite-ink and second nanocomposite-ink from diffusion of nanofillers of the first and second nanocomposite-inks, where the first nanocomposite was partially cured before deposition of the second nanocomposite-ink.

FIG. 2G is a cross-section view, schematically illustrating deposition of the nanocomposite-ink side-by-side.

FIG. 2H is a cross-section view, schematically illustrating that shown in FIG. 2G, where nanocomposite-ink mixing resulted in a slow transition in the refractive-gradient profile.

FIG. 2I is a cross-section view, schematically illustrating that shown in FIG. 2G, where nanocomposite-ink mixing resulted in a fast transition in the refractive-gradient profile.

FIG. 2J is a cross-section view, schematically illustrating mixing of nanocomposite-inks in air.

FIG. 5A, FIG. 5B, FIG. 5C and FIG. 5D are cross-section views schematically illustrating the optical-device with embedded components in accordance with the present disclosure.

DETAILED DESCRIPTION

Figure 1A:
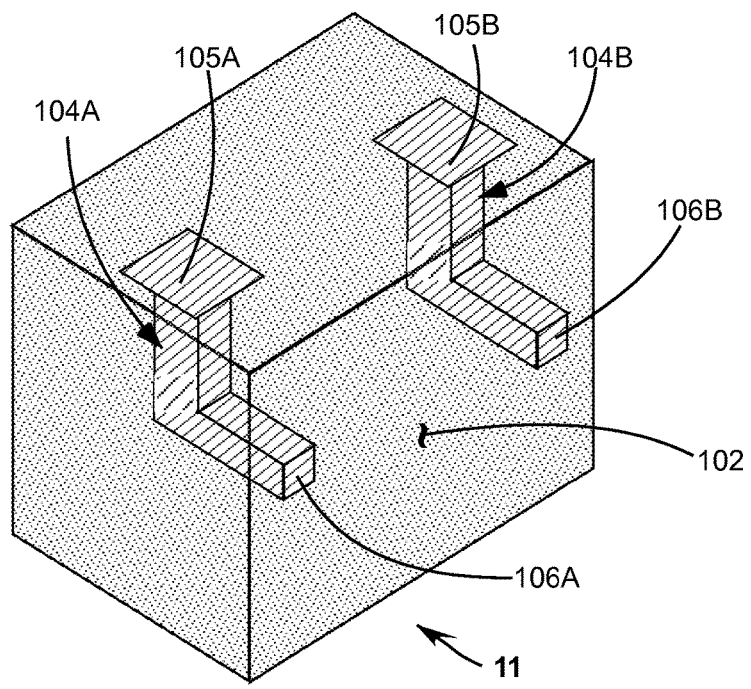
FIG. 1A is a perspective view, partly in cross-section of a nanocomposite optical device in accordance with the present disclosure, the optical-device comprising a cured optically transparent nanocomposite ink, a treated conductive nanocomposite-ink, the treated conductive nanocomposite-ink integrated within the nanocomposite structure; and wherein the treated nanocomposite-ink has electrical, thermal or both electric and thermal communication to the exterior of the optical device and the same communication with at least a portion of the optically transparent nanocomposite within the optical-device.

Referring now to the drawings, wherein like components are designated by like reference numerals. Drawings are characterized by Cartesian (mutually perpendicular) axes x, y, and z. Although anyone skilled in the art can transform the axis to other coordinates or topologies. When referring to an optical-device, the z-axis refers generally to the direction of light propagation, and x and y being transverse axes. Methods of manufacture and preferred embodiments of the present disclosure are described further herein below.

FIG. 1A is a transparent perspective view of an optical-device 11. Optical-device 11 comprises of a cured optically transparent nanocomposite-ink 102, a treated conductive nanocomposite-ink (conductive-inks) 104A and 104B, the treated conductive nanocomposite-ink integrated within nanocomposite structure 102. Wherein treated nanocomposite-ink 104A and 104B have electrical, thermal or both electric and thermal communication to the exterior of optical-device 11 and the same communication with at least a portion of optically transparent nanocomposite 102 within optical-device 11.

Here, conductive-inks 104A and 104B are exemplary of electrodes within the optical-device. Conductive-inks 104A and 104B are characterized by a pad 105A and a pad 105B on the exterior of optical-device 11 and a member 106A and a member 106B, respectively. Pads 104A and 104B can be sized to allow for probe contact, soldering, or heat transfer to a heat sink. Members 106A and 106B, each independently can have electrical, thermal, or both electrical and thermal communication from the pad to the member. The treated conductive-ink can be sized and arranged within the optical-device in proximity to one another for electric communication, generating electric fields between the members, or positioned to transfer heat from the surrounding nanocomposite to exterior pads 105A and 105B.

Figure 1B:
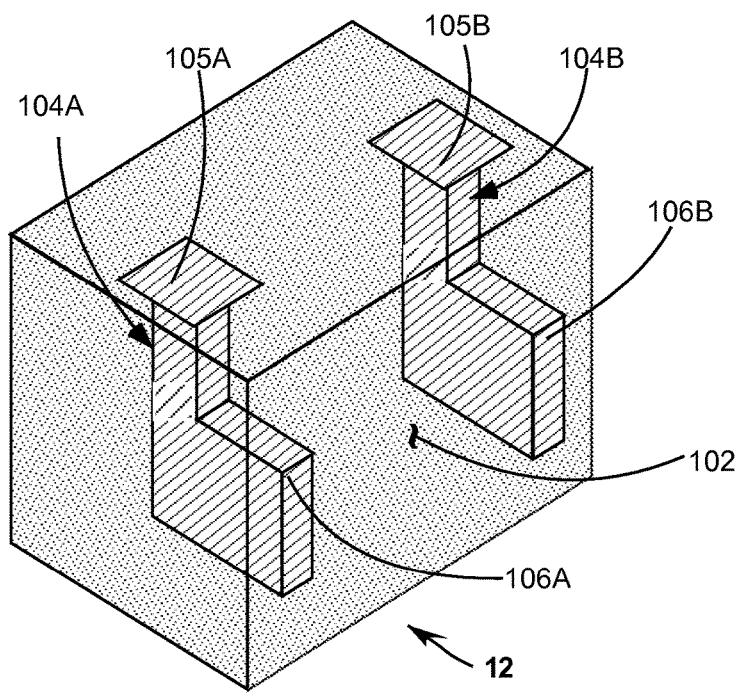
FIG. 1B is a plan view of that shown in FIG. 1A.

FIG. 1B is a transparent perspective view of optical-device 12. Optical-device 12 is similar to optical-device 11 of that shown in FIG. 1A, except here the members 106A and 106B are sized with larger area. Such a configuration allows for increased surface area for heat transfer or manipulation of electric fields applied across the members. The nanocomposite-ink and the conductive-ink may be deposited in any 3-dimensional shape within the nanocomposite via ink-jet printing and complimentary process described further hereinbelow.

Figure 2A:
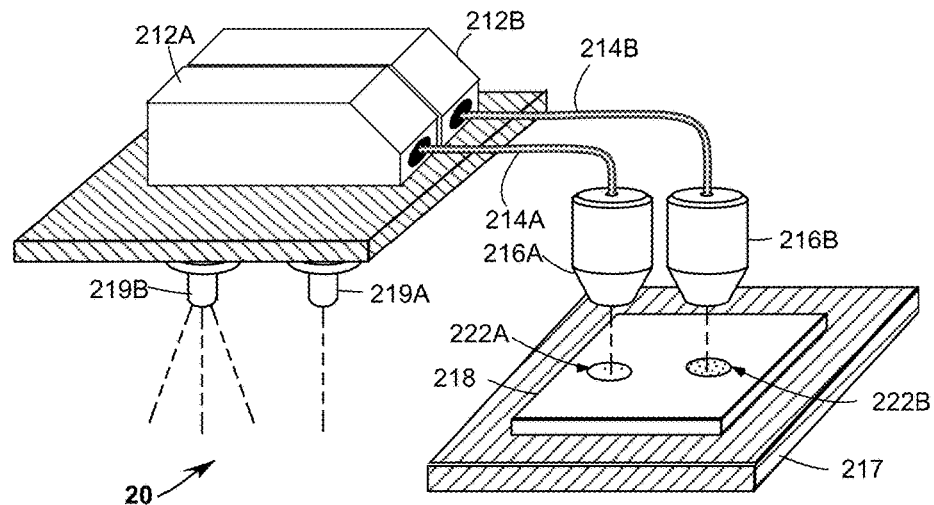
FIG. 2A is a perspective view, schematically illustrating an inkjet printer for printing nanocomposite-ink.

A preferred method of manufacture for the optical-device is by ink-jet printing technology. FIG. 2A shows an ink-jet printing apparatus 20 for deposition of nanocomposite-ink in accordance with the present disclosure. Printing apparatus 20 is simplified for explanatory purposes. Those skilled in the art will generally recognize the ink-jet printing approach, see Richard Chartoff et al., "Functionally Graded Polymer Matrix Nano-Composites by Solid Freeform Fabrication," presented at the 2003 Solid Freeform (SFF) symposium and Richard Chartoff et al., "Polymer Matrix Nanocomposites by Ink-jet Printing" presented at the SFF symposium in 2005, both incorporated by reference in their entireties for the purpose of explaining nanocomposite ink-jet printing.

Printing apparatus 20 has a reservoir 212A and a reservoir 212B that hold a nanocomposite-ink 222A and 222B, respectively. Reservoirs 222A and 222B provide a printhead 216A and 216B with a nanocomposite-ink 222A and 222B via a feed-line 214A and 214B, respectively. Printing-heads 216A and 216B deposit nanocomposite-ink 222A and 222B, on a substrate 218 at particular voxels, thereby forming a nanocomposite structure, such as the optical-devices of the present disclosure. Voxels refer to positions in three-dimensional space. A stage 217 positions substrate 218, with respect to the printing-heads, for deposition of the nanocomposite-inks at particular voxels.

Substrate 218 can be, or be made, from the group comprising plastics, glasses, metals, ceramics, organic resins, optics, molds, electronic circuits, light sources, wafers, and wafers with integrated electronics. Substrate 218 can become part of the optical element or alternatively the optical-device may be removed from the substrate. For applications in which the substrate becomes part of the optical-device, the substrate may be chosen for specific properties. For example, in applications where the optical-device will become integrated with a light source, the substrate material may be the light source. Alternatively, the substrate can be a mold material with anti-sticking properties, allowing removal of the optical-device from the mold.

After deposition of nanocomposite-ink from one of the printing-heads, substrate 218 can be positioned with respect to a radiation source 219A for selective-curing of the nanocomposite-ink, at voxels. Selective-curing refers to localized radiation about voxels, activating an organic-matrix, the organic-matrix a polymerizable component of the nanocomposite-ink. Activation of the organic-matrix solidifies the nanocomposite-ink thereby forming the nanocomposite. Selective-curing means zero-curing, partial-curing, or fully-curing, which respectively means not solidifying, partially solidifying, or fully solidifying the nanocomposite-ink. Another radiation source 219B flood cures the nanocomposite-ink on the substrate. Flood curing is desirable when the all the nanocomposite-ink needs to be partially or fully cured.

Figure 2B:
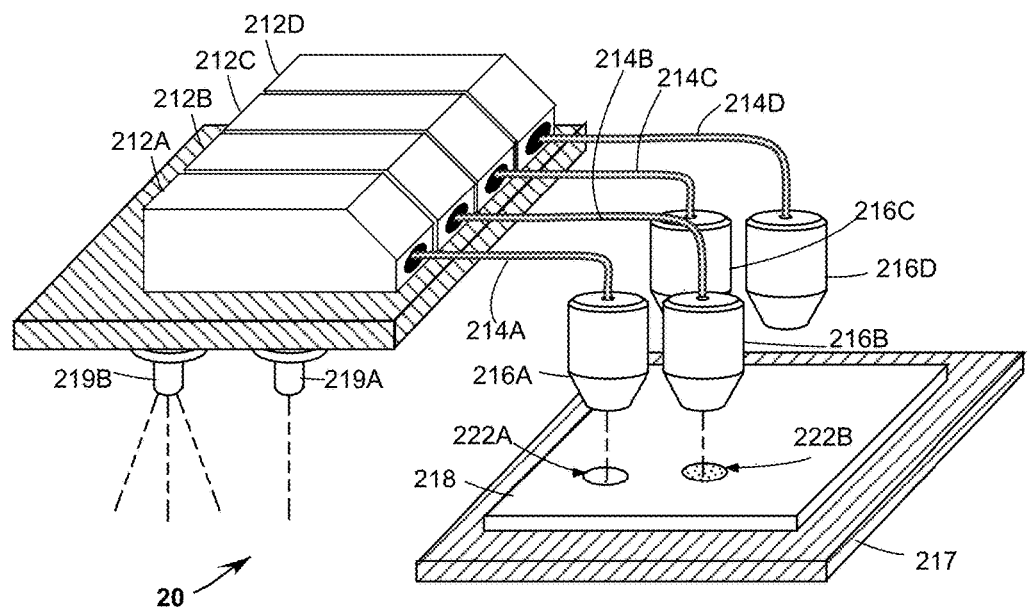
FIG. 2B is a perspective view of that shown in FIG. 2A with two additional printheads.

FIG. 2B illustrate printing apparatus 20 shown in FIG. 2A with an additional reservoir 212C and 212D, holding a nanocomposite-ink 222C and 222D, a feed-line 214C and 214D, and a printing head 216C and 216D. The additional printing heads provide additional nanocomposite-ink different from the nanocomposite-ink in other printing heads. For instance, one of the reservoirs can hold the nanocomposite-ink with one concentration of the nanofillers, another can hold the nanocomposite-ink with a different concentration of the nanofillers, yet another can hold the nanocomposite-ink with a different type of the nanofillers, last one can hold an organic-host material without nanofillers. The nanofillers and the organic-host can be chosen for other properties such as dielectric strength, thermal conductivity, electrical conductivity, coefficient of thermal expansion, or mechanical stability. Further, reservoirs can isolate the nanofillers and the organic-host and mix on demand for various nanofillers concentrations from any one of the printing heads.

FIG. 2C schematically illustrates further detail of the deposition of the nanocomposite-ink shown in FIGS. 2A and 2B. A nanocomposite-structure 21C has nanocomposite-ink 222A, deposited on substrate 218 is bounded by a nanocomposite-air interface 226A. The nanocomposite-ink consists of the organic-matrix with a dispersed nanofillers 224A throughout the organic-matrix. The organic-matrix is ink-jet printable, optically clear, photo-curable resin. Four non-limiting examples of printable organic-matrix material for are cyanoethyl pullulan (CYELP), polyacrylate, hexanediol diacrylate (HDODA), polymethyl methacrylate (PMMA), diethylene glycol diacrylate (DEGDA), cellulose, and organic resins such as from the SU-8 series resists. The nanofillers are preferably sized sufficiently small with respect to light wavelengths, for those wavelengths intended for use, not to scatter the light. Some nonlimiting examples of nanofillers include The nanocomposite-inks can be different by the nanofiller type, the organic-host matrix type, or concentration of the nanofillers and combinations thereof. Non-limiting examples of nanofillers include beryllium oxide (BeO), aluminum nitride (AlO), silicon carbide (SiC), zinc oxide (ZnO), zinc sulfide (ZnS), zirconium oxide (ZrO), yttrium orthovanadate ($YVO_4$), titanium oxide ($TiO_2$), copper sulfide ($CuS_2$), cadmium selenide (CdSe), lead sulfide (PbS), molybdenum disulfide ($MoS_2$) and silicon dioxide ($SiO_2$) including those with core, core-shell, and core-shell-ligand architectures. The refractive-index within the optical-device can be modified by the nanocomposite-ink used. The nanocomposite-ink can be tuned by the organic-matrix type, the nanofiller type, and the concentration of the nanofillers in the organic-matrix. The refractive-index of a nanocomposite-ink will be the summation by percent volume of the optical properties of the organic-matrix, or organic-host, and the nanofillers. Concentration by volume of the nanoparticles to the organic-host can be about 0.25% to about 70% volume, depending on desired properties.

FIG. 2D schematically illustrates a nanocomposite structure 21D, similar to that shown in FIG. 2C with an additional deposit of nanocomposite-ink 222B at a voxel above the voxel of nanocomposite-ink 222A. Here, nanocomposite-ink 222B is shown after deposition, characterized by a dispersed nanofiller 226B, an ink-ink interface 228A (where mixing between nanoparticle-inks has not yet occurred), and an air-ink interface 226B.

FIG. 2E schematically illustrates a nanocomposite structure 21E, similar to that shown in FIG. 2D, here the selective-curing of nanocomposite-ink 222A before deposition of nanocomposite-ink 222B was zero-curing. A nanocomposite-ink 230 is the resultant mixture of uncured nanocomposite 222A and 222B. Nanocomposite-ink 230 is characterized by an air-ink interface 232 and nanofillers 224A and 224B dispersed within. A refractive-gradient between the top and bottom of nanocomposite-ink 230 depends on convective mixing resulting from relative size, velocities, and nanofiller concentrations between the nanocomposite-inks, any partial-curing of nanocomposite-ink 222A drop before deposition of nanocomposite-ink 222B, the temperature of the substrate, and time allowed for diffusion of nanofillers from nanocomposite-inks 222A and 222B, before additional partial-curing of the nanocomposite-inks.

FIG. 2F schematically illustrates a nanocomposite structure 21F, similar to that shown in FIG. 2D. Here, nanocomposite-ink 222A was partially cured. Partial-cure of nanocomposite 222A results in a gradient-area 228B between nanocomposite 222A and 222B. The extent of gradient-area 228B depends on the selective-cure of nanocomposite-ink 222A. Zero-curing allows mixture of the nanocomposite-inks as exemplified in FIG. 2E. Partial-curing allows diffusion in a limited gradient area 228A as exemplified in FIG. 2F. Fully-curing allows little diffusion and results in a substantially ink-ink interface 228A as exemplified in FIG. 2D. In addition to controlling gradient-areas, partial-curing before subsequent deposition reduces stress and strain in the resultant optical-device.

FIG. 2G schematically illustrates a nanocomposite structure 21G, similar to that shown in FIG. 2A and FIG. 2B, except here the nanocomposite-ink is deposited side-by-side. Nanocomposite-ink 222B with nanofillers 224B and ink-air interface 226B is deposited along the side of a nanocomposite-ink 222C. Nanocomposite-ink 222C has no nanofillers, bound by an air-interface 226C.

FIG. 2H schematically illustrates a nanocomposite structure 21H, similar to that shown in FIG. 2G, except herenanocomposite-ink 222B has mixed with nanocomposite 222C resulting in a gradient nanocomposite 222D. Here nanocomposite 222D is bounded by an ink-air interface 226D, has a nanofillers 224D, the nanofillers the same as nanocomposite-ink 222B, distributed according to a refractive-gradient profile 229B. The gradient is a result of mixture of the nanocomposites where the partial-curing of nanocomposite 222B was minimal and aforementioned convective mixing and time was allowed before further partial-curing. Refractive-gradient profile 229B is characterized by a high refractive-index $n_B$, the high refractive-index due to higher concentration of nanoparticles 224D, the refractive-gradient's refractive-index slowly and smoothly transitioning in the y-direction to a low refractive-index $n_C$, the low refractive-index due to the low concentration of nanoparticles 224D.

The conductive nanocomposite-ink are preferably ink-jet printable. The conductive-inks can be deposited concurrently or after deposition of the optical nanocomposite-ink. Concurrent deposition allows for complex 3-dimensional configurations of the conductive-inks. The deposition of the optical nanocomposite-ink can be directly deposited onto smooth surfaces of the optical-device or deposited as structured surfaces. For instance the optical nanocomposite-ink can be deposited forming a structure or channel, then partially cured to allow for guided deposition of the conductive-ink without mixture of the two inks. Alternatively, UV lithography techniques, nanoimprinting, single point CNC, or fluid jet polishing can be used to form channels.

Two suitable types of electrically conductive-inks are metal-based and graphene-based. The metal-based conductive-inks include metalorganic decomposition ink (MOD-ink) and more generally, aqueous based conductive nanocomposite-ink. Of the metal-based conductive-inks, the aqueous based conductive-inks are the preferred. MOD-inks are solvent based inks with metallic salts such as silver salt. However, the preferred aqueous based nanocomposite-inks endows a variety of advantages over conventional MOD-ink based on organic solvents in printing narrow conductive patterns without irregular morphologies and without residual contaminants. The aqueous based metal nanocomposite-inks are suspensions of metal nanoparticles such as silver and copper. The aqueous-based nanocomposite-inks are commercially available at a variety of manufacturers, for example, silver based nanocomposite-inks are available at Novacentrix in Austin, Tex. in The United States, Cabot Corporation in Boston, Mass. in The United States, and Samsung ElectroMechanics in Suwon, Gyeongg-do in South Korea.

The metal-based conductive-ink requires treatment, usually a sintering process, in order to create continuous connectivity of the conductive nanoparticles. The sintering process can include implementation of a furnace to increase the temperature of the conductive-ink, but temperatures of the optical-device should be kept below the glass transition of the polymers. Preferably the temperature of the EO-modulator is kept below 150° Celsius (C). A number of techniques can be implemented to avoid high temperatures while allowing continuous connectivity of the conductive nanoparticles. Hydrochlorides solutions can be used to dissolve chemical coating on the nanoparticles. Direct localized heating of the conductive-inks can be achieved through direct resistive heating. Pulsed light can sinter the material via pulsed ultraviolet xenon arc lamps, near infrared, or other radiation sources.

The graphene-based nanocomposite-ink are suspensions of graphene, graphene-oxide, or other graphite-based particles. A typical procedure for preparing non-oxidized graphene-based conductive-ink is to grind natural graphite flakes into smaller particles, approximately 5 microns of less, then disperse in deionized water with or without a dispersing agent and with or without sonication. One example of a deionized water with a dispersing agent is Deionized water with 0.1% by weight of dispersing agent, Zonyl® FSO surfactant can be used to obtain a suspension of graphene flakes. Zonyl® FSO is available from DuPont, headquartered in Wilmington, Del. of the United States. Sonication aids in dispersing the graphite in the solution and reducing aggregation.

Another graphene-based (or graphite-oxide) nanocomposite-ink are suspensions of graphene-oxide flakes. Graphene-oxide can be obtained by oxidation of graphite using strong oxidizing agents. For example graphite flakes can be oxidized with sulfuric acid, nitrate, and potassium permanganate or with potassium chlorate and nitric acid, known as the Hummers and Brodie methods respectively. Oxygenated functionalization causes the graphene-oxide to have increased layer separation and make the material hydrophilic. Using sonication the graphene-oxide can be dispersed in water. Treatment of the graphene-oxide dispersion results in the conductive layers of graphene. Methods of treating the graphene-oxide solution includes treatment with hydrazine hydrate at 100 degrees Celsius for 24 hours, exposing the dispersion to hydrogen plasma for a few second, Joule heating by applying current to the conductive-inks, or by irradiating the dispersion with a strong pulse of light. Light of wavelengths in the ultraviolet, near-infrared, infrared, and microwave can be used. For treatment within the optical-device, light radiation from a laser can irradiate the conductive-inks either collectively with a large beam or selectively with a focused beam.

During treatment of the graphene-oxide, most carboxyl, hydroxyl and epoxide groups are removed from the graphene-oxide, resulting in conductive graphene. During this process gases, for example CO and $CO^2$ are formed. For those conductive-inks that are encapsulated in the nanocomposite, voids can be made into the optical-device allowing escape of gases during treatment.

Yet another of the conductive-inks are carbon nanotube (CNT) based inks. CNT-based ink are prepared with a conductive polymer such as poly(3,4-ethylenedioxythiophene)-poly(styrene sulfonate) (PEDOT-PSS) and carboxyl functionalized single-walled carbon nanotubes (SWCNT-COOHs).

Graphene, graphene-oxide, and other graphene based products are commercially available at a variety of manufacturers. For example, graphene products are available from; Graphene Supermarket in Calverton, N.Y. of the United States, ACS Material of Medford, Mass. of the United States, and Grafen Chemical Industries Co. of Ankara, Turkey.

For those configurations of the optical-device in which a conductive path is required for external communication, like that shown in FIG. 1A, a metal-metal contact, pad, or interface can be made as is well known in the art. For the carbon-based conductive-inks a metal-graphene interface can be made. Some nonlimiting examples of wetting metals that allow for low resistance contact are Nickel, Titanium (Ti) and Palladium (Pd). One process that allows lower resistance is through metal-catalyzed etching in hydrogen, nano-sized pits in the graphene can be created, then the graphene can be metalized with one of the above materials, the deposited metals forming bonds with the zigzagged edges around the pits.

High loading of thermally conductive nanoparticles, such as aluminum nitride, or other ceramics and metal-oxides nanoparticles allow for thermally conductive, yet electrically insulated conductive-inks. Such inks can be used as heat sinks and thermal connection to components within the optical-device.

Figure 3:
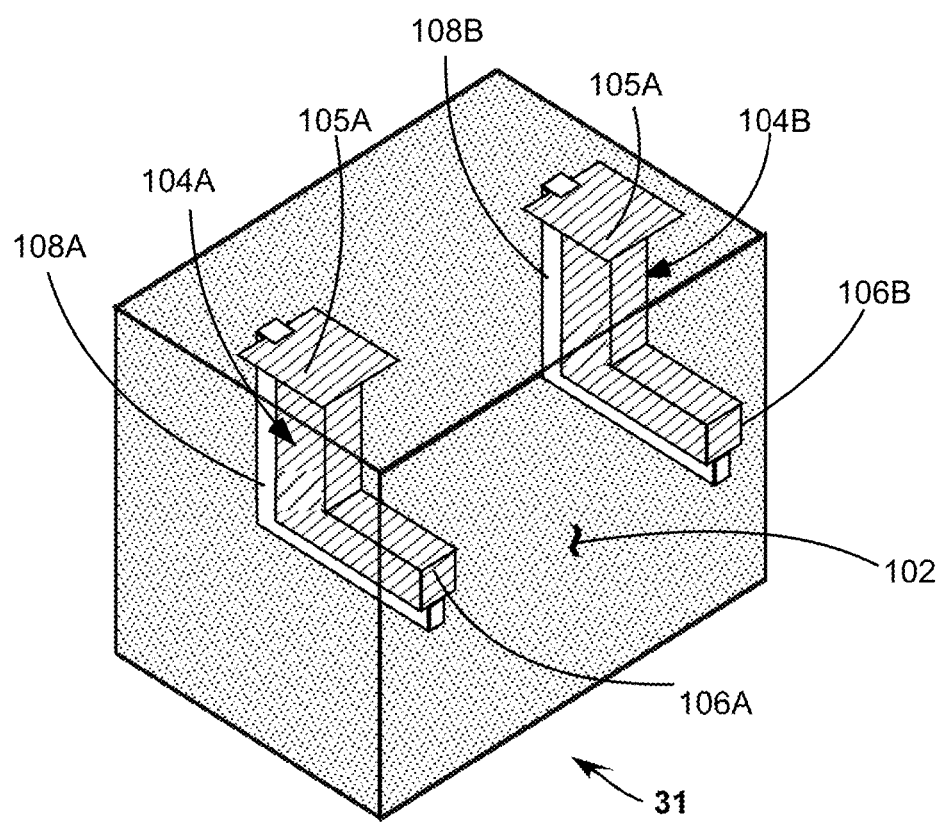
FIG. 3 is a cross-section view schematically illustrating that shown in FIG. 1A with the addition of voids.

FIG. 3A is a perspective-view, schematically illustrating an optical-device 31. Optical-device 31 is similar to the optical-device shown in FIG. 1A, but further comprising a void 108A and 108B. Voids 108A and 108B allow for gas escape during treatment of the conductive-inks 104A and 104B, respectively.

Figure 4A:
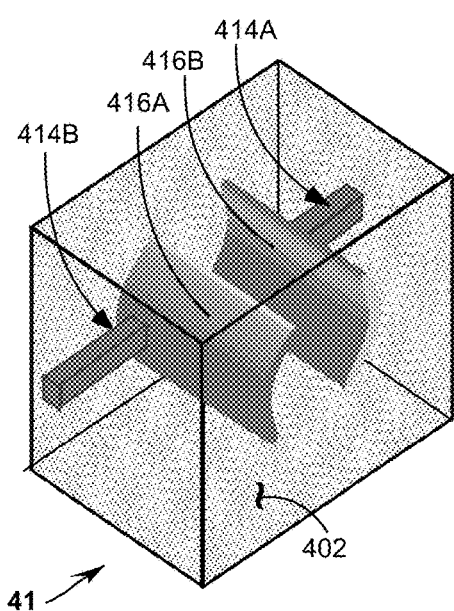
FIG. 4A, FIG. 4B, FIG. 4C and FIG. 4D are perspective views, partly in cross-section views schematically illustrating possible geometries of the conductive-inks of the optical-device in accordance with the present disclosure.
Figure 4B:
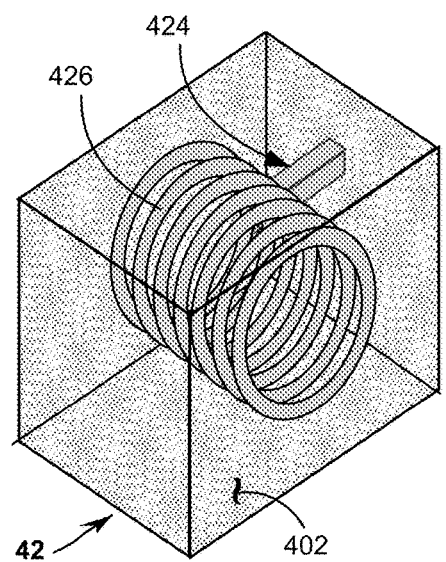
Figure 4C:
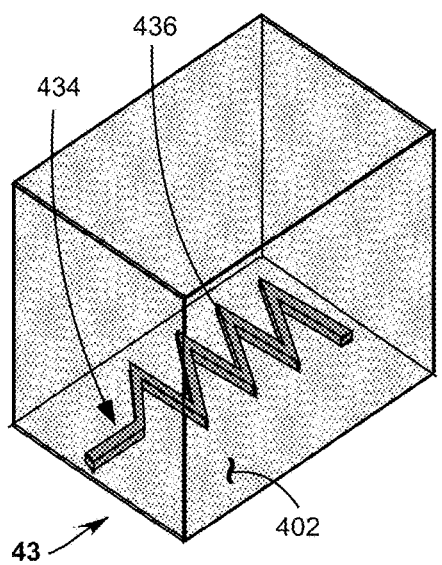
Figure 4D:
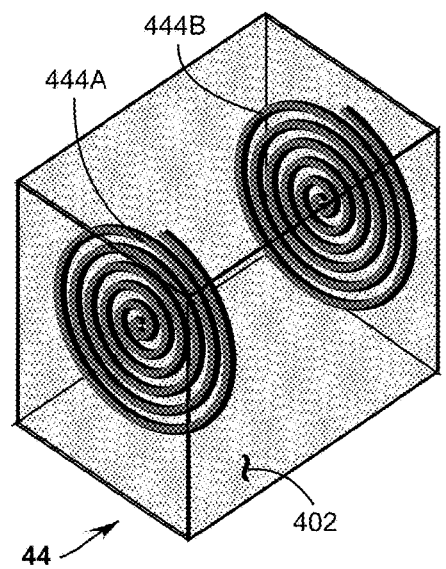

FIG. 4A, FIG. 4B, FIG. 4C, and FIG. 4D schematically illustrate various geometries of the nanocomposite-ink within the optical-device in accordance with the present disclosure. FIG. 4A is a perspective view, partly in cross-section, illustrating an optical-device 41. Optical-device 41 is characterized by an optical nanocomposite-ink 402 and a treated conductive nanocomposite-ink 414A and 414B. Treated nanocomposite-ink 414A and 414B each have a elongated semi-circular members 416A and 416B. FIG. 4B is a perspective view, partly in cross-section, illustrating an optical-device 42. Optical-device 42 is characterized by optical nanocomposite-ink 402 and a treated conductive nanocomposite-ink 424. Treated nanocomposite-ink 424 has a helix shaped conductive member 426. FIG. 4C is a perspective view, partly in cross-section, illustrating an optical-device 43. Optical-device 43 is characterized by optical nanocomposite-ink 402 and a treated conductive nanocomposite-ink 434. Treated nanocomposite-ink 434 has a zigzag shaped conductive member 436. FIG. 4D is a perspective view, partly in cross-section, illustrating an optical-device 44. Optical-device 44 is characterized by optical nanocomposite-ink 402 and a treated conductive nanocomposite-ink 444A and 444B. Treated nanocomposite-ink 444A and 444B are both spiral shaped.

FIG. 5A, FIG. 5B, FIG. 5C, and FIG. 5D schematically illustrate various embodiments of the present where components are embedded within the optical-device. FIG. 5A is a cross-section view illustrating an optical-device 51. Optical-device 51 is characterized by an optical nanocomposite-ink 502 and a treated conductive nanocomposite-ink 514A and 514B. Treated nanocomposite-ink 514A and 514B have electrical communication with an integrated circuit 518, the integrated circuit embedded within nanocomposite-ink 502. Treated nanocomposite-ink 514A and 514B terminate on the exterior of optical-device 51 at a contact pad 515A and 515B respectively.

FIG. 5B is a cross-section view illustrating an optical-device 52. Optical-device 52 is characterized by optical nanocomposite-ink 502 and a treated conductive nanocomposite-ink 524A, 524B and 524C. Treated nanocomposite-ink 524A has an exterior electric pad 525A and is in electric communication with integrated circuit 518. Treated nanocomposite-ink 524B has an exterior electric pad 525B and is in electric communication with an embedded resistor 520. Treated nanocomposite-ink 524C has electrical communication with integrated circuit 518 and a capacitor 520. Capacitor 520 can be either an electrical component embedded within the nanocomposite-ink or alternatively the conductive-ink can be deposited in various capacitor geometries such a s plane-parallel, circular, grid, or other well-known geometries.

FIG. 5C is a cross-section view illustrating an optical-device 53. Optical-device 53 is characterized by optical nanocomposite-ink 502 and a treated conductive nanocomposite-ink 534A and 534B. Treated nanocomposite-ink 534A and 534B have electrical communication with a photonic sensor 530, the photonics sensor embedded within nanocomposite-ink 502. The photonics sensor can be a photodiode, thermopile, or gyro sensor. The optical nanocomposite-ink can be arranged such that light incident on the surface of the optical-device is directed to the sensor. Alternatively an electro-optic of optically nonlinear nanofillers can be utilized for modulation or optical limiting purposes.

FIG. 5D is a cross-section view illustrating an optical-device 54. Optical device 54 is characterized by optical nanocomposite-ink 502 and a treated conductive nanocomposite-ink 544A, 544B, and 544C. Treated conductive nanocomposite-ink 544A has an exterior pad 545A and is in electrical communication with a light-emitting-diode (LED) 542. Treated conductive nanocomposite-ink 544B has an exterior pad 545B and is in electrical communication with LED 542. LED 542 has a semiconductor sub-mount 541. Sub-mount 541 is on top of a conductive nanocomposite-ink 544C. Here conductive nanocomposite-ink is thermally conductive and is not electrically conductive. Conductive nanocomposite-ink 544C provides thermal communication between the LED and exterior of the optical-device, thereby acting as a heat sink. Alternatively the heat sink could be the substrate, made from a metal, ceramic, or other thermally conductive material.

The optical-device and various embodiments described have a variety of useful utilities and applications. In general, the optical-device described herein allows manufacture of any optic which requires thermal or electrical communication-within the device. For example, the conductive-ink can be deposited in the shape of a aperture and absorb or reflect light while allowing heat to dissipate to the external surface of the optical-device. The conductive-ink can act as electrical circuitry within the optical-device allowing for modulation of electro-optic or optically nonlinear nanocomposite materials. Additionally the conductive-ink can be deposited to form an antenna or inductive loop antenna, to communicate with or charge other components within the optical-device.

From the description of the present disclosure provided herein one skilled in the art can design the optical-device and implement them in the described applications in accordance with the present disclosure. Those skilled in the art to which the present disclosure pertains will recognize that while above-described embodiments of the inventive optical-device and method of manufacture are exemplified using particular configurations, others may be used without departing from the spirit and scope of the present disclosure. Further, combinations of the various described embodiments and the combinations of refractive-gradients described in those embodiments can be implemented.

In summary, the present invention is described above in terms of particular embodiments. The invention, however, is not limited to the embodiments described and depicted herein. Rather, the invention is limited only by the claims appended hereto.

What is claimed is:

1. A nanocomposite optical device comprising;
    a cured optically transparent nanocomposite ink;
    a treated conductive nanocomposite-ink, the treated conductive nanocomposite-ink integrated within the nanocomposite optical device, wherein the treated conductive nanocomposite-ink is a conductive nanocomposite-ink that has been processed in order to make the conductive nanocomposite-ink into a conductive solid; and
    wherein the treated nanocomposite-ink has electrical, thermal or both electric and thermal communication to the exterior of the optical device and the same communication with at least a portion of the cured optically transparent nanocomposite within the optical-device.

2. The optical-device of claim 1, wherein the cured nanocomposite-ink is metal based.

3. The optical-device of claim 1, wherein the cured nanocomposite-ink is carbon based including graphite, graphene, and graphene-oxide.

4. The optical-device of claim 1, wherein a plurality of cured optically transparent nanocomposite-inks are used.

5. The optical-device of claim 4, wherein the cured optically transparent nanocomposite-ink is comprised of one or more optically non-linear nanofiller.

6. The optical-device of claim 4, wherein the cured optically transparent nanocomposite-ink is comprised of an electro-optic nanofiller.

7. The optical-device of claim 1, wherein the cured nanocomposite-ink terminates externally in a pad.

8. The optical-device of claim 7, wherein the pad is sized sufficient for probe contact.

9. The optical-device of claim 7, wherein the pad sized sufficient for soldering.

10. The optical-device of claim 1, further comprising a substrate.

11. The optical-device of claim 10, wherein the substrate is a wafer with microelectronics.

12. The optical-device of claim 10, wherein the substrate is glass, the glass less than 205 microns thick.

13. The optical-device of claim 1, wherein the optically transparent nanocomposite-ink allows for optical treatment of the conductive nanocomposite-ink.

14. The optical-device of claim 1, further comprising voids, the voids in proximity to the conductive nanocomposite-ink and terminate on the exterior of the optical-device.

15. The optical-device of claim 1, wherein the nanocomposite structure is an electro-optic modulator.

16. The optical-device of claim 1, wherein an integrated circuit is included within the optical-device.

17. The optical-device of claim 1, wherein passive components, including resistors, capacitors, or inductors are integrated within the device.

18. The optical-device of claim 1, wherein conductive leads connect multiple integrated circuits.

19. A method of manufacturing a nanocomposite optical device of claim 1 comprising:
    (a) providing a substrate;
    (b) depositing at least one optically transparent nanocomposite-ink and selectively curing the nanocomposite-ink, thereby forming a nanocomposite structure;
    (c) depositing a conductive nanocomposite-ink onto the nanocomposite structure;
    (d) repeating steps (b) and (c) thereby forming a nanocomposite structure;
    (e) Treating the conductive nanocomposite-ink.

20. The method of claim 19, further comprising an additional step of depositing at least one of the optically transparent nanocomposite-ink and selectively curing the nanocomposite-ink, thereby encapsulating the conductive nanocomposite-ink.

21. The method of claim 19, wherein the conductive nanocomposite-ink comprises of a solution with particles from the group comprising of graphene, graphene oxide, and graphite.

22. The method of claim 19, wherein the conductive nanocomposite-ink is a metal based ink.

23. The method of claim 19, wherein the nanocomposite structure has integrated voids, the voids in proximity to the conductive nanocomposite-ink.

24. The method of claim 19, wherein the treatment of the conductive-ink includes applying a bias across two terminal of the conductive-ink such that electrical current flows through causing Joule heating of the conductive-ink.

25. The method of claim 19, wherein treatment of the conductive-ink includes optical irradiation with ultraviolet, visible, or microwave wavelengths and combinations thereof.

26. The method of claim 25, wherein irradiation is performed through one or more surfaces of the optical device, the surfaces including the bottom, top, and side surfaces of the optical device.

27. The method of claim 19, further comprising the step of applying a microwave field curing of one or more layers of the optical-device.

* * * * *